United States Patent
Yu et al.

(10) Patent No.: US 12,093,781 B2
(45) Date of Patent: Sep. 17, 2024

(54) METHOD AND SYSTEM FOR COUPLING ANY TWO QUBITS FROM AMONG MULTIPLE SUPERCONDUCTOR QUANTUM BITS

(71) Applicants: SOUTHERN UNIVERSITY OF SCIENCE AND TECHNOLOGY, Shenzhen (CN); Fudan University, Shanghai (CN)

(72) Inventors: Dapeng Yu, Shenzhen (CN); Jiansheng Wu, Shenzhen (CN); Jiang Xiao, Shanghai (CN); Song Liu, Shenzhen (CN); Shaojie Yuan, Shenzhen (CN)

(73) Assignees: Southern University of Science and Technology, Guangdong (CN); Fudan University, Shanghai (CN)

( * ) Notice: Subject to any disclaimer, the term of this patent is extended or adjusted under 35 U.S.C. 154(b) by 596 days.

(21) Appl. No.: 16/757,680

(22) PCT Filed: Mar. 5, 2019

(86) PCT No.: PCT/CN2019/076924
§ 371 (c)(1),
(2) Date: Apr. 20, 2020

(87) PCT Pub. No.: WO2019/205810
PCT Pub. Date: Oct. 31, 2019

(65) Prior Publication Data
US 2020/0250567 A1 Aug. 6, 2020

(30) Foreign Application Priority Data
Apr. 25, 2018 (CN) .......................... 201810380235.6

(51) Int. Cl.
*G06N 10/00* (2022.01)
*B82Y 25/00* (2011.01)
*B82Y 10/00* (2011.01)

(52) U.S. Cl.
CPC .............. *G06N 10/00* (2019.01); *B82Y 25/00* (2013.01); *B82Y 10/00* (2013.01)

(58) Field of Classification Search
CPC ......... B82Y 10/00; B82Y 25/00; G06N 10/00
See application file for complete search history.

(56) References Cited

U.S. PATENT DOCUMENTS

| | | | |
|---|---|---|---|
| 7,212,026 B2 * | 5/2007 | Bourianoff | H03K 19/16 326/1 |
| 7,528,456 B1 * | 5/2009 | Khitun | H03K 19/18 257/E43.001 |

(Continued)

FOREIGN PATENT DOCUMENTS

| | | |
|---|---|---|
| CN | 105 070 824 A | 11/2015 |
| CN | 107 204 813 A | 9/2017 |

(Continued)

OTHER PUBLICATIONS

Gundogan et al., "Solid State Spin-Wave Quantum Memory for Time-Bin Qubits," Physical Review Letters 114 (2015) 230501.*

(Continued)

*Primary Examiner* — Jay C Kim
(74) *Attorney, Agent, or Firm* — KDW Firm PLLC (57) ABSTRACT

Provided are a method for coupling any two qubits from among multiple superconducting qubits and a system thereof, which are applied to an occasion provided with a multi-superconducting-qubit array and a magnetic film material capable of implementing spin waves. The method includes: disposing a magnetic film material below a multi-superconducting-qubit array; forming, through a combination of magnetization directions of magnetic domains in the (Continued)

magnetic film material, multiple channels through which the spin waves pass; disposing multiple qubits of the multi-superconducting-qubit array above the multiple channels through which the spin waves pass correspondingly to implement a coupling between each qubit and the spin waves; and disposing at least two qubits above one spin wave channel and implementing a coupling between the at least two qubits through the coupling between each qubit and the spin waves.

6 Claims, 4 Drawing Sheets

(56) References Cited

U.S. PATENT DOCUMENTS

| | | | |
|---|---|---|---|
| 7,535,070 B2* | 5/2009 | Eshaghian-Wilner | ...................... H01L 29/66984 257/E43.001 |
| 8,183,652 B2* | 5/2012 | Ranjan | ................... H10N 50/85 365/158 |
| 9,129,679 B2* | 9/2015 | Fukuzumi | ............... H10B 61/00 |
| 9,159,342 B2* | 10/2015 | Kudo | ...................... G11B 5/314 |
| 9,711,201 B1* | 7/2017 | Wang | ................... G11C 11/1675 |
| 9,767,876 B2* | 9/2017 | Khitun | ................ G11C 11/1675 |
| 10,217,522 B2* | 2/2019 | Wang | ................. G11C 11/1675 |
| 10,255,556 B2* | 4/2019 | Hollenberg | ............ G06N 20/00 |
| 10,361,292 B2* | 7/2019 | Nikonov | ................ B82Y 10/00 |
| 2007/0296516 A1 | 12/2007 | Eshaghian-Wilner et al. | |
| 2010/0148853 A1 | 6/2010 | Harris et al. | |

FOREIGN PATENT DOCUMENTS

| | | |
|---|---|---|
| CN | 107 564 868 A | 1/2018 |
| CN | 206 977 434 U | 2/2018 |
| JP | 2004 186274 A | 7/2004 |
| JP | 2013 045840 A | 4/2013 |
| WO | WO 2011/118374 A1 | 9/2011 |
| WO | WO 2014/207818 A1 | 12/2014 |
| WO | WO 2017/178704 A1 | 10/2017 |

OTHER PUBLICATIONS

Andrich et al., "Long-range spin wave mediated control of defect qubits in nanodiamonds," Nature Partner Journals : Quantum Information (2017).*
Khitun et al., "Spin-wave utilization in a quantum computer," Physical Review A 64 (2001) 062304.*
Khitun et al., "Feasibility study of the spin wave quantum network," 10th International Symposium on Nanostructures: Physics and Technology, Proceedings of SPIE vol. 5023 (2003) pp. 449-451.*
Berger, "Emission of spin waves by a magnetic multilayer traversed by a current," Physical Review B 54 (1996) pp. 9353-9358.*
Jacak, L. et al, "Spin-based Quantum Information Processing in Magnetic Quantum Dots", Open Systems and Information Dynamics, Kluwer Academic Publishers, Do. vol. 12, No. 3, Jun. 1, 2005, pp. 133-141.
Tabuchi Yutaka et al, "Coherent Coupling Between Ferromagnetic Magnon and Superconducting Qubit", Retrieved from the Internet: url: http://arxiv.org/pdf/1410.3781, Oct. 14, 2014.
Japanese Office Action for Application No. 2019567584 dated Mar. 22, 2021.
European Search Report for Application No. 19792154 dated Dec. 21, 2021.
International Search Report for Application No. PCT/CN2019/076924 dated Jun. 3, 2019.
Chinese Office Action for Application No. 201810380235.6 dated Dec. 23, 2019.

* cited by examiner

METHOD AND SYSTEM FOR COUPLING ANY TWO QUBITS FROM AMONG MULTIPLE SUPERCONDUCTOR QUANTUM BITS

CROSS-REFERENCE TO RELATED APPLICATION

This is a National stage application, filed under 37 U.S.C. 371, of International Patent Application NO. PCT/CN2019/076924, filed on Mar. 5, 2019, which claims the priority to a Chinese patent application NO. 201810380235.6 filed on Apr. 25, 2018, disclosures of which are incorporated herein by reference in their entirety.

TECHNICAL FIELD

The present application relates to the field of superconducting quantum technology, and, in particular, to a method for coupling any two qubits from among multiple superconducting qubits.

BACKGROUND

Superconducting qubits are considered as one of the most promising solid-state method for implementing a quantum computer due to their advantages in controllability, low loss and scalability. Coherent controllable coupling between qubits is a necessary condition for achieving large-scale quantum computation.

Currently, it is well-known to couple superconducting qubits through capacitance, inductance or a superconducting Josephson junction. In such a coupling mode, it is needed to connect two to-be-coupled qubits through fixed wiring (hard wiring). This method is space-constrained, and only coupling between several qubits adjacent to one superconducting qubit or between several remote qubits. However, in the application of quantum computation and quantum information, coupling between any two of multiple qubits is often required, and the coupling cannot be implemented in a hard-wired mode.

SUMMARY

On this basis, it is necessary to provide a method for coupling any two qubits from among multiple superconducting qubits and a system thereof to solve the problem in which coupling between any two of multiple qubits cannot be implemented in the hardwired mode.

A method for coupling any two qubits from among multiple superconducting qubits is provided in the present disclosure. The method is applied to an occasion provided with a multi-superconducting qubit array and a magnetic film material 100 capable of implementing spin waves. The method includes the steps described below.

The magnetic film material 100 is disposed below the multi-superconducting-qubit array 200.

Multiple spin wave channels through which the spin waves pass are formed through a combination of magnetization directions of magnetic domains in the magnetic film material 100.

Multiple qubits of the multi-superconducting-qubit array are disposed above the multiple spin wave channels through which the spin waves pass correspondingly, so as to implement a coupling between each qubit and the spin waves.

At least two qubits are disposed above one spin wave channel through which the spin waves pass. The coupling between the at least two qubits is implemented through the coupling between the each of the at least two qubits and the spin waves.

According to the method for coupling any two qubits from among the multiple superconducting qubits provided in the present application, a structure where a superconducting qubit layer and a magnetic film material 100 layer are disposed in an upper layer and a lower layer along the vertical direction respectively is adopted, and the state change of the each qubit of the superconducting qubit layer is transferred through the spin waves of the magnetic film material 100 layer. Finally, the coupling between any two superconducting qubits is implemented through both the soft connection of the spin waves, and the coupling between the each superconducting qubit and the spin waves.

In one embodiment of the present disclosure, the multiple spin wave channels through which the spin waves pass are changed by changing the combination of the magnetization directions of the magnetic domains in the magnetic film material.

In one embodiment of the present disclosure, the spin waves at least include a first spin and a second spin. The first spin correspondingly acts on a first qubit of the multi-superconducting-qubit array. The second spin correspondingly acts on a second qubit of the multi-superconducting-qubit array.

In one embodiment of the present disclosure, the coupling between the first spin and the first qubit is implemented, the coupling between the second spin and the second qubit is implemented. The coupling between the first qubit and the second qubit is implemented through the spin waves.

In one embodiment of the present disclosure, the coupling energy of multiple superconducting qubit coils and the spin waves is adjusted by adjusting the number density of the first spin and the second spin of the spin waves.

In one embodiment of the present disclosure, the coupling energy of the multiple superconducting qubit coils and the spin waves is adjusted by adjusting the vertical distance between the multiple superconducting qubit coils and the magnetic film material.

In one embodiment of the present disclosure, the coupling energy of the multiple superconducting qubit coils and the spin waves is adjusted by adjusting magnetization directions or magnetization intensities of the magnetic domains in the magnetic film material.

A qubit coupling system is provided in the present disclosure. The system includes multiple superconducting qubit array, a magnetic film material a driving apparatus.

The multi-superconducting-qubit array includes multiple qubit coils.

The magnetic film material is configured to form multiple spin wave channels by using magnetic domain walls between magnetic domains as waveguides. The driving apparatus is configured to apply a magnetic field to the magnetic film material to drive spin waves in the multiple spin wave channels.

The multi-superconducting-qubit array, the magnetic film material and the driving apparatus are sequentially disposed along the vertical direction.

In one embodiment of the present disclosure, the magnetic film material is divided into multiple magnetic domain elements, and the magnetization directions of the multiple magnetic domain elements are changed through the driving apparatus.

| magnetic film material | 100 |
| first spin | 101 |
| second spin | 102 |
| superconducting-qubit array | 200 |
| first qubit | 201 |
| second qubit | 202 |
| driving apparatus | 300 |

DETAILED DESCRIPTION

The object, features and advantages of the present application will be more apparent from the detailed description of the present application in conjunction with the drawings. Details are set forth below to facilitate a thorough understanding of the present application. However, the present disclosure can be implemented in many modes different from the embodiments described herein, and those skilled in the art can make similar modifications without departing from the connotation of the present application, so the present application is not limited by the embodiments described below.

Figure 1:
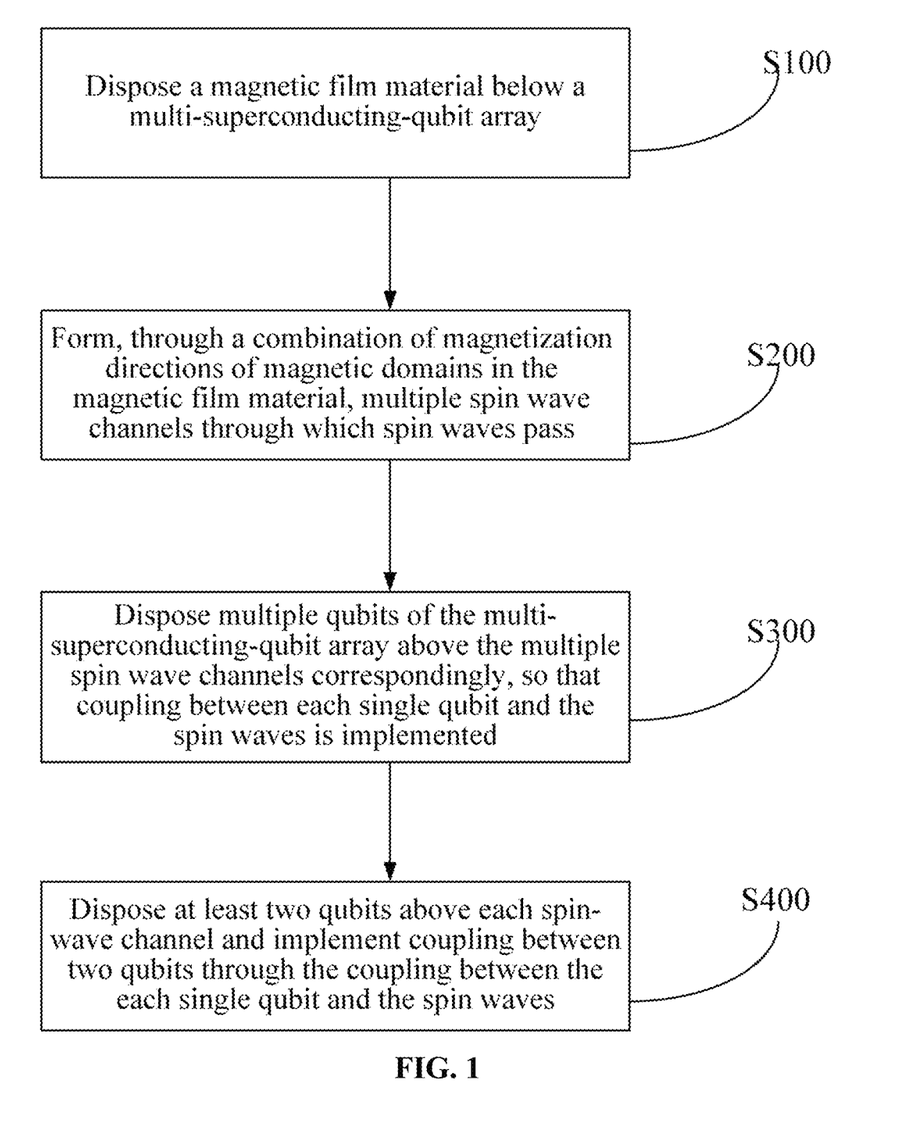
FIG. 1 is a flowchart of a qubit coupling method according to an embodiment of the present application.

Referring to FIG. 1, the present application provides a method for coupling any two qubits from among multiple superconducting qubits. The method is applicable to an occasion provided with a multi-superconducting-qubit array 200 and a magnetic film material 100 capable of implementing spin waves. The method includes the steps described below.

In S100, the magnetic film material 100 is disposed below the multi-superconducting-qubit array 200.

In S200, multiple spin wave channels through which the spin waves pass are formed through a combination of magnetization directions of magnetic domains in the magnetic film material 100.

In S300, multiple qubits of the multi-superconducting-qubit array (200) are disposed above the multiple spin wave channels through which the spin waves pass correspondingly, so that a coupling between each qubit and the spin waves is implemented.

In S400, at least two qubits are disposed above one spin-wave channel, and a coupling between the at least two qubits is implemented through the coupling between the each of the at least two qubits and the spin waves.

In S100, the magnetic film material 100 is disposed below the multi-superconducting-qubit array 200 in the vertical direction, so that the multiple qubits of multi-superconducting-qubit array 200 are coupled through the magnetic film material 100.

The multi-superconducting-qubit array 200 is composed of the multiple qubits. The multiple qubits are formed by multiple qubit coils (also referred to as superconducting qubit coils). The state of each qubit coil is separately controlled by an additional wire. The magnetic film material 100 is used for forming the multiple spin wave channels. The magnetic film material (100) may be divided into multiple elements. Each element is one magnetic domain, which is also referred to as a magnetic domain element. The magnetization directions of the magnetic domains may be separately controlled.

Figure 2:
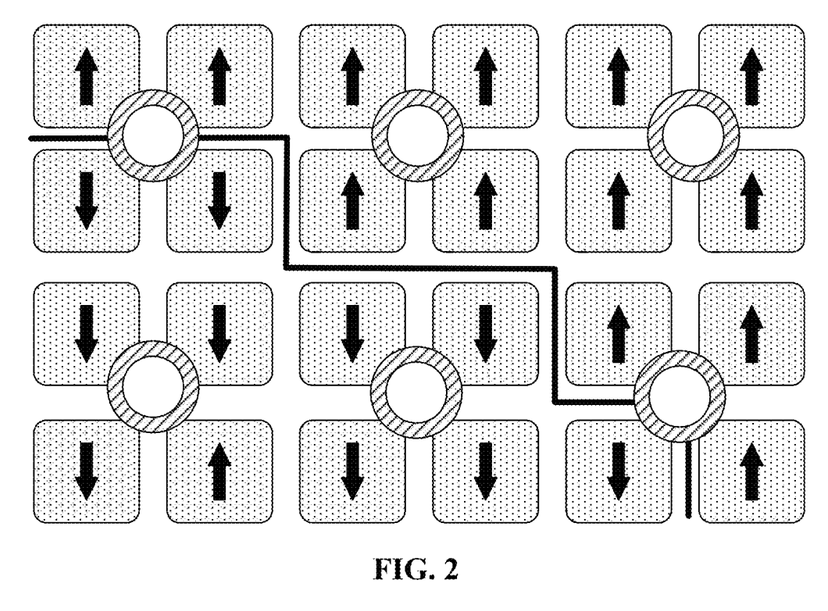
FIG. 2 is a top view of a magnetic film material and a qubit array according to an embodiment of the present application.

Specifically, referring to FIG. 2, in the magnetic material, due to the competition between an exchange effect, anisotropy of a magnetic crystal and a magnetic dipole-dipole interaction, in a system, in order to reduce the total energy, small magnetized regions having different directions will spontaneously be formed, which is so-called the magnetic domains, while the transition region of adjacent magnetic domains is a magnetic domain wall. Theoretical calculation shows that the spin waves have a bound-state solution in the magnetic domain wall, and the energy gap of this spin wave mode is zero in the case where only the exchange effect and the anisotropy of the magnetic crystal are considered. Due to this feature, the magnetic domain wall can serve as a spin wave channel for conducting the spin waves.

In S200, the multiple spin wave channels through which the spin waves pass are formed through the combination of magnetization directions of the magnetic domains in the magnetic film material 100. The magnetic film material 100 is provided with multiple magnetic domain elements. The multiple magnetic domain elements have their respective magnetization directions. The transition region of adjacent magnetic domain elements forms the magnetic domain wall, that is, the spin wave channel of the present application, for conducting one or more spin waves.

Furthermore, the formation of the magnetic domains may be controlled through the applied magnetic field, and whether the directions of the adjacent magnetic domains are the same or different can determine whether the magnetic domain wall exists between the magnetic domains. Only when the magnetization directions between adjacent magnetic domain elements are different, does the magnetic domain wall, that is, the spin wave channel, exist. Otherwise, no domain wall exists. The layout of the magnetic domain wall varies with the arrangement of the magnetic domains, thus reconstruction can be performed between both the magnetic domains and the magnetic domain walls, and any spin wave wiring mode can be obtained through editing of the arrangement of the magnetic domains.

Specifically, a driving apparatus 300 is disposed below the magnetic film material 100. The apparatus is used for applying the magnetic field to the magnetic film material 100 to drive one or more spin waves in the magnetic domain wall, that is, the spin wave channel.

In one embodiment, the driving apparatus 300 disposed below the magnetic film material 100 is a circuit board with a specific wiring mode.

In S300, the multiple qubits of the multi-superconducting-qubit array 200 are disposed above the multiple spin wave channels through which the spin waves pass correspondingly, so that the coupling between the each qubit and the spin waves is implemented.

Figure 3:
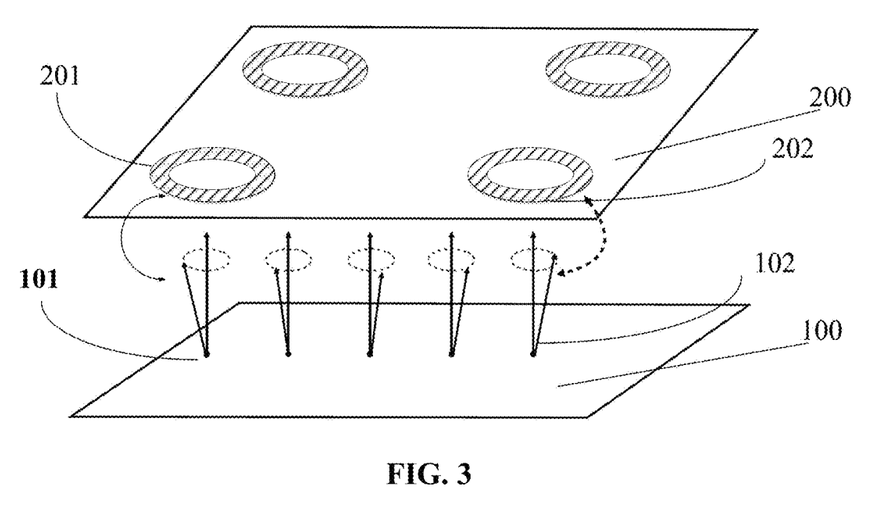
FIG. 3 is a side view of a magnetic film material and a qubit array according to an embodiment of the present application.
Figure 4:
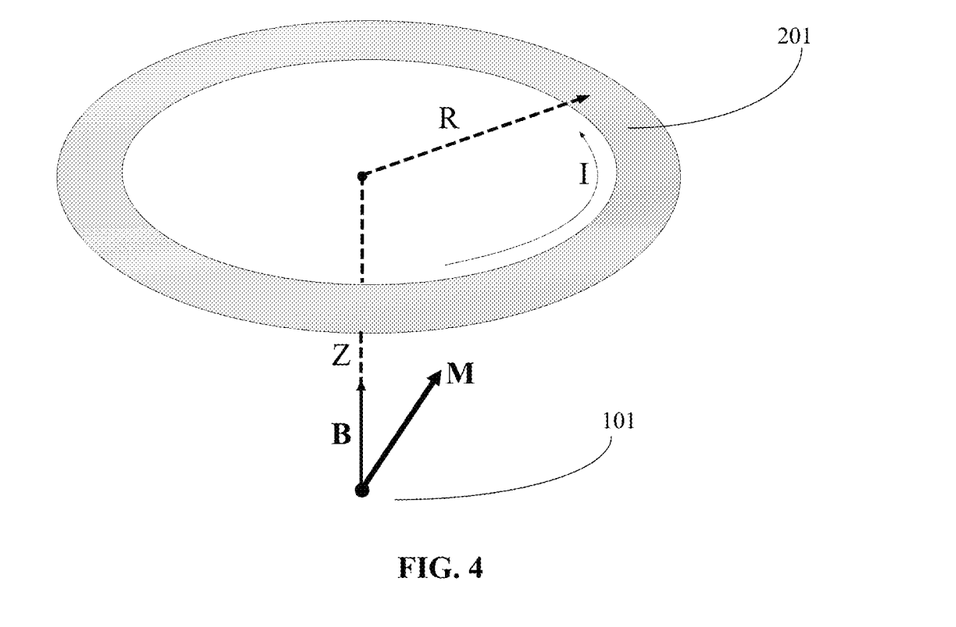
FIG. 4 is a structure view of a spin of spin waves and a qubit according to an embodiment of the present application.

Referring to FIGS. 3 and 4, the multiple qubit coils of the multi-superconducting-qubit array 200 are disposed above the spin wave channel, so that the coupling between the spin waves in the spin wave channel and the each qubit is implemented. A path along which the spin waves can travel is defined through an adjustment to the combination of the magnetization directions of the magnetic domain elements in the magnetic film material 100, so that the multiple superconducting qubits above the path can be connected through the spin waves so as to be coupled.

In S400, at least two qubits are disposing above one spin wave channel, and the coupling between the at least two qubits is implemented through the coupling between the each of the at least two qubits and the spin waves.

Referring to FIG. 3, a spin wave channel includes at least a first spin 101 and a second spin 102. The first spin 101 correspondingly acts on a first qubit 201 of the multi-superconducting-qubit array 200. The second spin 102 correspondingly acts on a second qubit 202 of the multi-superconducting-qubit array 200. Further, the coupling between the first spin 101 and the first qubit 201 is implemented and the coupling between the second spin 102 and the second qubit 202 is implemented.

In one embodiment, after the coupling between the first spin 101 and the first qubit 201 is implemented and the coupling between the second spin 102 and the second qubit 202 is implemented, the state change of the first qubit 201 in the superconducting qubit layer acts on the first spin 101 of the spin waves through inter-layer coupling, and then the state change is transferred to the second spin 102 through the spin waves traveling along the specific path of the spin wave channel. After that, the state change acts on the second qubit 202 through the interlayer coupling. In this way, the coupling between the first spin 101 and the second spin 102 is established, and at the same time, the coupling between the first qubit 201 and the second qubit 202 is also established. The traveling path of the spin waves, that is, the path of the spin wave channel, may be controlled through the adjustment to the combination of the magnetization directions of the magnetic domains in the magnetic film material 100, so that the coupling between any two qubits can be implemented.

In one embodiment, one qubit may be coupled to at least one spin wave and may be coupled to the multiple spin waves.

Referring to FIG. 4, in one embodiment, a single qubit coil generates the magnetic field to act on the spins in the spin wave channel. When the radius R=1 μm and the superconducting critical current I=100 nanoamps in one coil, the magnetic field at the center of the coil is about 0.001 gauss. Such a magnetic field generates about 1 electronvolt of energy on a single spin. When the magnetic film material 100 is disposed below the superconducting qubit coil, the single superconducting qubit coil can couple to 1 million to 10 million spins, the total energy of the superconducting qubit coil can reach 1 micro-electronvolt to 10 micro-electronvolts that are close to the energy level difference between two quantum states of one superconducting qubit. Therefore, the coupling between the superconducting qubit coil and the magnetic film material 100 can change the state of the superconducting qubit. It is also known that the energy amplitude of a spin wave is within 3000 micro-electronvolts to 10000 micro-electronvolts that are much greater than the coupling energy and is capable of transferring this coupling energy.

Further, the magnitude of the coupling energy may be adjusted through: (1) an adjustment to the number density of the spin in the magnetic domains in the magnetic film material 100, (2) an adjustment to the distance between the multiple superconducting qubit coils and the magnetic film material 100, and (3) an adjustment to the magnetization directions or magnetization intensities of the magnetic domains in the magnetic film material 100.

Figure 5:
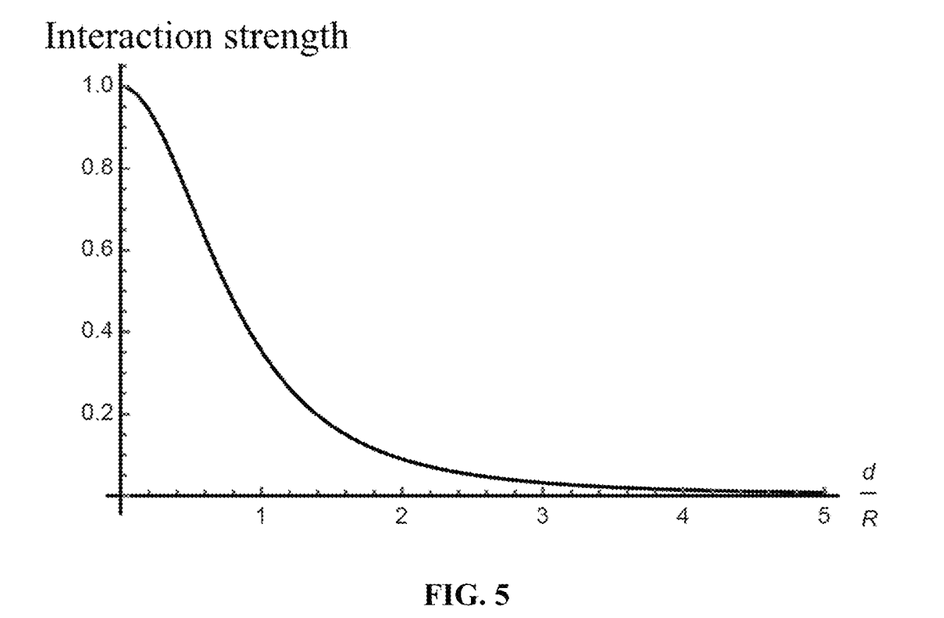
FIG. 5 is a graph of a coupling strength change according to an embodiment of the present application.

Referring to FIG. 5, in one embodiment, as the distance between the plane in which the multiple superconducting qubit coils are located and the plane in which the spin waves are located increases, the coupling between the multiple qubit coils and the spin waves will decay rapidly, so the magnitude of the coupling can be adjusted through the vertical distance between the multiple superconducting qubit coils and the magnetic film material.

In one embodiment, the magnetization directions of ferromagnetic domains on both sides of one spin wave channel, which is covered by superconducting qubit coils, are opposite, so the overall magnetic flux is zero and the superconductivity will not be destroyed. For the same purpose, the ferromagnetic magnetic domains may be replaced by antiferromageic domains, so that the superconductivity can be prevented from being destroyed by the high magnetic field.

According to the method for coupling any two qubits from among the multiple superconducting qubits provided in the present application, a structure where a superconducting qubit layer is disposed in an upper layer and a magnetic film material 100 layer is disposed in a lower layer along the vertical direction respectively is adopted, and the state change of the multiple qubits of the superconducting qubit layer is transferred through the spin waves of the magnetic film material 100 layer. Finally, the coupling between any two superconducting qubits is implemented through both the soft connection of the spin waves, and the coupling between the each superconducting qubit and the spin waves. At the same time, the magnitude of the coupling energy can be adjusted according to multiple methods, for example, the adjustment to the number density of the spin in the magnetic domains in the magnetic film material 100, the adjustment to the distance between the multiple superconducting qubit coils and the magnetic film material 100, the adjustment to the magnetization directions or magnetization intensities of the magnetic domains in the magnetic film material 100, or the like. Moreover, the traveling path of the spin wave can be changed through an adjustment to the distribution of the multiple magnetic domain elements, so that the coupling between any two superconducting qubits is further implemented.

Figure 6:
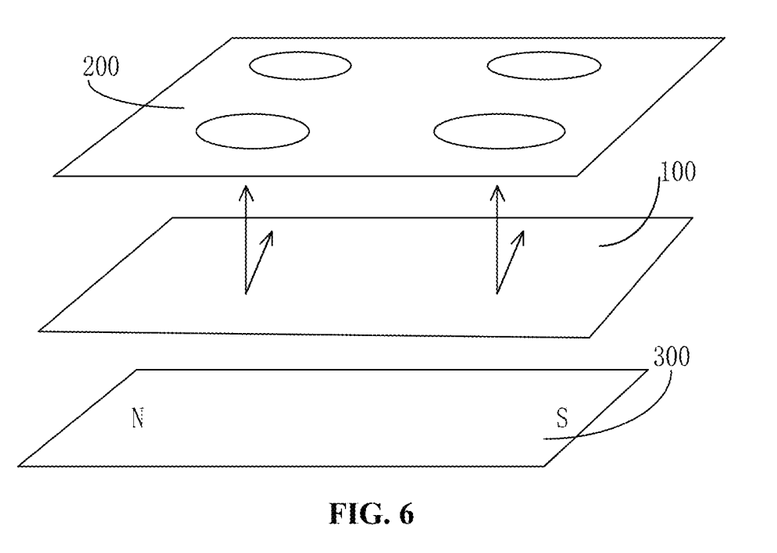
FIG. 6 is a schematic view of a qubit coupling system according to an embodiment of the present application.

Referring to FIG. 6, the present application provides a qubit coupling system. The system is provided with a multi-superconducting-qubit array 200, a magnetic film material 100 and a driving apparatus 300 sequentially along the vertical direction. The driving apparatus 300 is used for applying a magnetic field to the magnetic film material to drive spin waves in a spin-wave channel.

The multi-superconducting-qubit array 200 is composed of multiple qubits. The multiple qubits are formed by multiple qubit coils. The state of each qubit coil is separately controlled by an additional wire. The magnetic film material 100 is used for forming the spin wave channel. The magnetic film material 100 may be divided into multiple elements. Each element is one magnetic domain. The magnetization direction of the magnetic domain of the each element may be separately controlled.

In one embodiment, the magnetic film material 100 is used for forming the spin wave channel. The magnetic film material 100 may be divided into multiple elements. Each element is one magnetic domain. The magnetization direction of the magnetic domain of the each element may be separately controlled. In the magnetic material, due to the competition between an exchange effect, anisotropy of a magnetic crystal and a magnetic dipole-dipole interaction, in a system, in order to reduce the total energy, small magnetized regions having different directions will spontaneously be formed, which is so-called the magnetic domains, while the transition region of adjacent magnetic domains is a magnetic domain wall. Theoretical calculation shows that the spin waves have a bound-state solution in the magnetic domain wall, and the energy gap of the spin wave mode is zero in the case where only the exchange effect and the anisotropy of the magnetic crystal are considered. Due to this feature, the magnetic domain wall can serve as a spin wave channel for conducting the spin waves. Magnetization directions of the spin waves are perpendicular to the multiple superconducting qubit coils as shown in FIGS. 3, 4 and 6. It is to be noted that the magnetization directions of the spin waves may be parallel to the multiple superconducting qubit coils, as long as the coupling effect between the spin waves and the multiple superconducting qubit coils can be generated.

In one embodiment, a structural modification between adjacent magnetic domains, may be performed by using a manual method, for example, fabricating a trench or the like to pin the magnetic-domain wall to the boundary of the magnetic-domains.

In one embodiment, the formation and the magnetization direction of magnetic domains may be controlled through the applied magnetic field, and whether the magnetization directions of adjacent magnetic domains are the same or different can determine whether the magnetic domain wall exists between the magnetic domains. Only when the magnetization directions between adjacent magnetic-domain elements are different, does the magnetic domain wall, that is, the spin-wave channel, exists. Otherwise, no domain wall exists. The layout of the magnetic domain wall varies with the arrangement of the magnetic domains, thus reconstruction can be performed between both the magnetic domains and the magnetic domain walls, and any spin wave wiring mode can be obtained through editing of the arrangement of the magnetic domains.

In one embodiment, the driving apparatus 300 disposed below the magnetic film material 100 is a circuit board with a specific wiring mode, and is used for applying the magnetic field to the magnetic film material to drive one or more spin waves in the magnetic domain wall, that is, the spin wave channel.

In one embodiment, when the anisotropy of the magnetic crystal is uniaxial anisotropy, only a 180-degree magnetic domain wall exists in the material; and when the anisotropy of the magnetic crystal is biaxial or cubic anisotropy, a 90-degree or 180-degree magnetic domain wall exists in the material. A material with higher-fold symmetry may have more types of magnetic-domain walls.

In one embodiment, after the coupling between a first spin 101 and a first qubit 201 is implemented and the coupling between a second spin 102 and a second qubit 202 is implemented, the state change of the first qubit 201 in the superconducting qubit layer acts on the first spin 101 of the spin waves through interlayer coupling, and then the state change is transferred to the second spin 102 through the spin-wave traveling along the specific path of the spin wave channel. After that, the state change acts on the second qubit 202 through the inter-layer coupling. In this way, the coupling between the first spin 101 and the second spin 102 is established, and at the same time, the interaction between the first qubit 201 and the second qubit 202 is also established. The traveling path of the spin waves, that is, the path of the spin wave channel, may be controlled through the adjustment to the combination of the magnetization directions of the magnetic domains in the magnetic film material 100, so that the coupling between any two qubits can be implemented.

In one embodiment, each qubit may be coupled to at least one spin wave and may be coupled to multiple spin waves.

The qubit coupling system provided in the present application adopts a structure where the superconducting qubit layer and the magnetic film material 100 layer are disposed in an upper layer and a lower layer respectively along the vertical direction. In the system, the driving apparatus 300 is used for applying the magnetic field to the magnetic film material to drive one or more spin waves in the magnetic domain wall, that is, the spin wave channel. In the system, the state change of the multiple qubits of the superconducting qubit layer is transferred through the spin waves of the magnetic film material 100 layer. The coupling between any two superconducting qubits is implemented through both the soft connection of the spin waves, and the coupling between the each superconducting qubit and the spin waves. At the same time, the magnitude of the coupling energy may be adjusted according to multiple methods, for example, an adjustment to the number density of spins in the magnetic domains in the magnetic film material 100, an adjustment to the distance between the multiple superconducting qubit coils and the magnetic film material 100, an adjustment to the magnetization directions or magnetization intensities of the magnetic domains in the magnetic film material 100, or the like. Moreover, the traveling path of the spin wave channel can be changed through an adjustment to the distribution mode of multiple magnetic domain elements, so that the coupling between any two superconducting qubits is further implemented.

The technical features of the above embodiments may be combined in any way. For conciseness, not all possible combinations of the technical features in the above embodiments are described. However, as long as the combinations of these technical features do not conflict, these combinations should be considered to be within the scope of the specification.

The above embodiments are merely several embodiments of the present application. These embodiments are described in a specific and detailed manner but cannot be understood as a limit to the scope of the present application. It is to be noted that for those skilled in the art, a number of improvements and modifications can be made without departing from the concept of the present disclosure, and these improvements and modifications are within the scope of the present disclosure. Therefore, the scope of the present disclosure is defined by the appended claims.

What is claimed is:

1. A qubit coupling method, comprising:
disposing, in a vertical direction, a magnetic film material composed of 2M*2N magnetic domain elements below a multi-superconducting-qubit array composed of M*N qubits, wherein the magnetic film material is disposed in a first horizontal plane, the multi-superconducting-qubit array is disposed in a second horizontal plane, a vertical distance between the second horizontal plane in which the multi-superconducting-qubit array is disposed and the first horizontal plane in which the magnetic film material is disposed is greater than 0, each of the 2M*2N magnetic domain elements of the magnetic film material is a ferromagnetic material, each of the 2M*2N magnetic domain elements comprises a magnetic domain, and a magnetic domain wall is formed between every two adjacent magnetic domain elements with opposite magnetization directions; and each of the M*N qubits is formed by a respective one of superconducting qubit coils and corresponds to a center of respective 2*2 magnetic domain elements in the vertical direction, wherein each of the superconducting qubit coils is controlled by a respective one of additional wires, and each of M and N is a positive integer greater than 1;

disposing, in the vertical direction, a driving apparatus below the magnetic film material, wherein the driving apparatus is a circuit board with a specific wiring mode and is configured to control a magnetization direction of each of the 2M*2N magnetic domain elements;

applying, by the driving apparatus, magnetic fields to the magnetic film material to control magnetization directions of a part of the 2M*2N magnetic domain elements to be a first direction and magnetization directions of another part of the 2M*2N magnetic domain elements to be a second direction, which is opposite to the first direction, wherein a spin wave channel composed of magnetic domain walls is formed between the part of the 2M*2N magnetic domain elements with the magnetization directions being the first direction and the other part of the 2M*2N magnetic domain elements with the magnetization directions being the second direction; and applying, by superconducting qubit coils of two qubits corresponding to the spin wave channel in the vertical direction, magnetic fields to the magnetic film material such that a first spin located in the spin wave channel and corresponding to a first qubit of the two qubits in the vertical direction is coupled to the first qubit, a second spin located in the spin wave channel and corresponding to a second qubit of the two qubits in the vertical direction is coupled to the second qubit, a state change of the first qubit is transferred to the second qubit by spin waves formed in the spin wave channel, and the state change of the first qubit acts on the second qubit to enable the two qubits to be coupled to each other, wherein the first spin comprises at least one spin, the second spin comprises at least one spin, and the two qubits are any two qubits corresponding to the spin wave channel in the vertical direction.

2. The qubit coupling method according to claim 1, further comprising:
changing the spin wave channel by changing magnetization directions of the 2M*2N magnetic domain elements in the magnetic film material through the driving apparatus.

3. The qubit coupling method according to claim 1, further comprising:
in a case where the first spin comprises a plurality of spins, adjusting coupling energy generated between the first spin and the first qubit of the two qubits by adjusting a number density of the plurality of spins comprised in the first spin, and, in a case where the second spin comprises a plurality of spins, adjusting the coupling energy generated between the second spin and the second qubit of the two qubits by adjusting a number density of the plurality of spins comprised in the second spin.

4. The qubit coupling method according to claim 3, further comprising:
adjusting the coupling energy generated between the first spin and the first qubit of the two qubits and the coupling energy generated between the second spin and the second qubit of the two qubits by adjusting the vertical distance between the second horizontal plane in which the multi-superconducting-qubit array is disposed and the first horizontal plane in which the magnetic film material is disposed.

5. The qubit coupling method according to claim 3, further comprising:
adjusting the coupling energy generated between the first spin and the first qubit of the two qubits and the coupling energy generated between the second spin and the second qubit of the two qubits by adjusting magnetization directions or magnetization intensities of the 2M*2N magnetic domain elements in the magnetic film material through the driving apparatus.

6. A qubit coupling system, comprising a multi-superconducting-qubit array, a magnetic film material and a driving apparatus, wherein the multi-superconducting-qubit array, the magnetic film material and the driving apparatus are coupled in accordance with the qubit coupling method according to claim 1.

* * * * *